United States Patent
Masai et al.

(10) Patent No.: US 7,369,008 B2
(45) Date of Patent: May 6, 2008

(54) MOS VARACTOR AND VOLTAGE-CONTROLLED OSCILLATOR USING THE SAME

(75) Inventors: Shigeo Masai, Sagamihara (JP); Yuichi Tateyama, Sagamihara (JP); Takashi Otsuka, Yokohama (JP); Hisato Takeuchi, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 118 days.

(21) Appl. No.: 11/362,186

(22) Filed: Feb. 27, 2006

(65) Prior Publication Data

US 2006/0202773 A1    Sep. 14, 2006

(30) Foreign Application Priority Data

Feb. 28, 2005 (JP) ............................ P2005-052848

(51) Int. Cl.
*H03B 5/12* (2006.01)

(52) U.S. Cl. .................... 331/177 V; 331/158

(58) Field of Classification Search ............ 331/177 V, 331/158, 176
See application file for complete search history.

(56) References Cited

U.S. PATENT DOCUMENTS 6,040,744 A * 3/2000 Sakurai et al. ............... 331/176

6,737,929 B1 * 5/2004 Cui et al. ............... 331/177 V

FOREIGN PATENT DOCUMENTS

| JP | 11-220329 | 8/1999 |
|---|---|---|
| JP | 2003-318417 | 11/2003 |

* cited by examiner

*Primary Examiner*—Joseph Chang
(74) *Attorney, Agent, or Firm*—McDermott Will & Emery LLP

(57) ABSTRACT

To provide a MOS varactor in which oscillation frequency variation is small and variation in a capacitance changing voltage is small, and a voltage-controlled oscillator using the MOS varactor, as a load capacitor of an oscillating circuit composed of a feedback resistor 1, an amplifier 2, and a crystal vibrator 3, a variable electrostatic capacitor, which is generated between drain/source terminals and a gate terminal of each of MOS transistors 5a and 6a each of which source and drain terminals are short-circuited, is connected. A bulk terminal of each of the MOS transistors 5a and 6a is connected to one terminal of a resistor 19, a voltage is applied to the other terminal of the resistor 19, the bulk terminal of each of the MOS transistors 5a and 6a is connected to one terminal of a capacitor 20, and the other terminal of the capacitor 20 is grounded.

9 Claims, 6 Drawing Sheets

STATE OF Vg < VFB

FIG. 7 (B)

STATE OF VFB ≤ Vg

FIG. 7 (C)

STATE OF VTH ≤ Vg

MOS VARACTOR AND VOLTAGE-CONTROLLED OSCILLATOR USING THE SAME

BACKGROUND OF THE INVENTION

1. Field of the Invention

The present invention relates to a MOS varactor and to a voltage-controlled oscillator used as a VCTCXO (voltage-controlled temperature-compensated crystal oscillator).

2. Description of the Related Art

Recently, according to the rapid development of mobile communication equipment such as a mobile phone, the communication equipment has been required to additionally have various functions such as a temperature compensating function, a small size, and a high use frequency. For this reason, similar to the communication equipment, even in a crystal oscillator used as a reference of a communication frequency, a temperature compensating function, a small size, and a high use frequency has been required.

Since a temperature compensated crystal oscillator has a temperature compensating function and the frequency variation thereof due to temperature change is small, the temperature compensated crystal oscillator is widely used as a reference frequency source of a mobile phone and so on. A voltage-controlled oscillator has, as a load capacitor in an oscillating loop, a variable capacitive element capable of changing the capacitance by a voltage, and can change the capacitance value of the load capacitor by controlling a terminal voltage of the variable capacitive element so as to control a frequency. As the temperature compensating crystal oscillator, there is one in which a terminal voltage of a varactor of a voltage-controlled oscillator is controlled such that a temperature characteristic of a crystal vibrator (a piezoelectric resonator) is canceled.

Recently, the temperature-compensated crystal oscillator has been made to have a small size as well as low phase noise, short starting time, and high accuracy of the temperature compensation. In order to reduce the size of the crystal oscillator, the size of a crystal vibrator should also be reduced. However, the rate of the frequency variation to the variation of the variable capacitance generally tends to decrease as the crystal vibrator becomes small.

Figure 5:
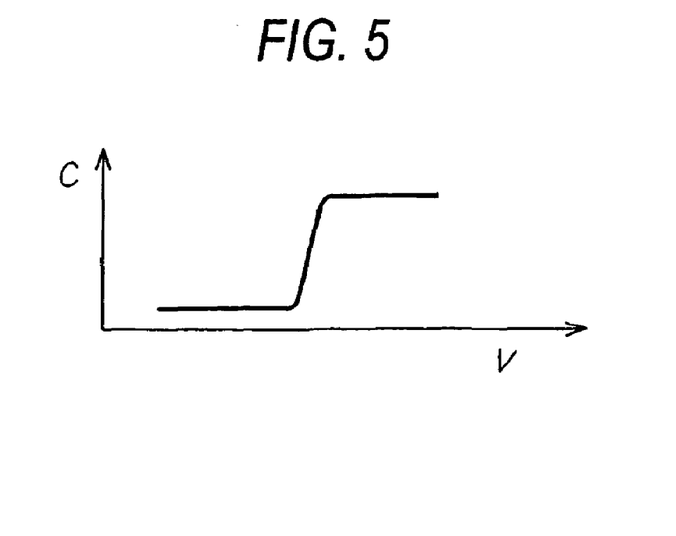
FIG. 5 is a view showing a C-V characteristic explaining the related art.

Consequently, it is necessary to make the variation in the capacitance of a varactor used as a load capacitor with respect to a control voltage large. For example, as disclosed in JP-A-2003-318417 and JP-A-11-220329, it is possible to make the variation in the capacitance value with respect to the variation of the control voltage large by using an electrostatic capacitance generated between source/drain terminals and a gate terminal of a MOS transistor, thereby capable of improving the sensitivity of the crystal oscillator with respect to frequency variation (see FIG. 5).

Figure 6:
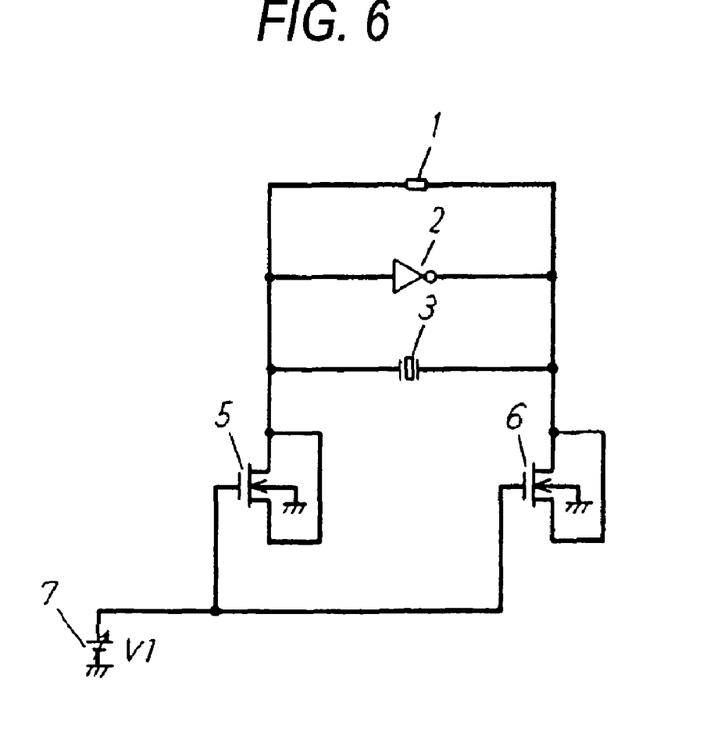
FIG. 6 is a circuit diagram schematically showing the configuration of a voltage-controlled oscillator according to the related art.

For example, as an example of the voltage-controlled oscillator shown in FIG. 6, a voltage-controlled oscillator has been proposed in which first and second MOS transistors 5 and 6 serving as varactors are connected to both terminals of an amplifier having a feedback resistor 1 and an inverter 2 and both terminals of a piezoelectric resonator 3. In the varactors, source/drain terminals of the first and second MOS transistors 5 and 6 are short-circuited, and an electrostatic capacitance generated between the source/drain terminals and a gate terminal of each of the first and second MOS transistors 5 and 6 is controlled by a voltage source 7 connected to the gate terminal.

Figure 7:
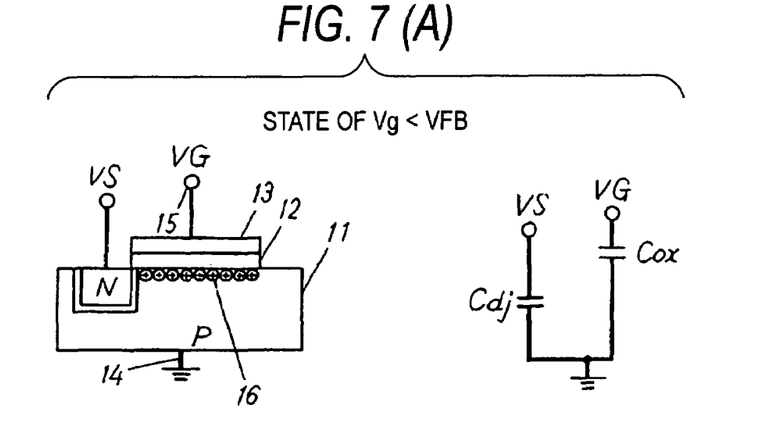

FIG. 7 is a view showing the configuration of a MOS varactor. The MOS varactor is composed of a thin silicon oxide film 12 and an N-type polysilicon gate electrode 13 formed on a P-type semiconductor substrate 11. The MOS varactor is a two-terminal variable capacitor which uses a bulk terminal 14 connected to the semiconductor substrate 11 as a ground potential and uses a gate terminal 15 connected to the gate electrode 13 for both a capacitive terminal and a control terminal. A flat band voltage of the MOS configuration is denoted by a symbol 'VFB' and a threshold voltage when an inversion layer is generated on a surface of the semiconductor substrate 11 is denoted by a symbol 'VTH'.

When a gate voltage Vg is lower than the VFB, as shown in a schematical configuration view of FIG. 7A, holes 16 are drawn and accumulated on a surface of the semiconductor substrate 11. At this time, the MOS capacitance is composed of only a capacitance Cox of a gate oxide film to be maximal, as shown in an equivalent circuit diagram of FIG. 7B.

Next, when the gate voltage is higher than the VFB, as shown in a schematically configuration view of FIG. 7B, a depletion layer 17 is formed on the surface of the semiconductor substrate 11. Therefore, the MOS capacitance becomes a series capacitance of the capacitance Cox of the gate oxide film and the capacitance of the depletion layer as shown in an equivalent circuit diagram of FIG. 7B. As a result, the MOS capacitance is reduced as the gate voltage increases.

Subsequently, when the gate voltage reaches the VTH, as shown in a schematical configuration view of FIG. 7C, a few electrons are induced on the surface of the semiconductor substrate 11 such that an inversion layer 18 is formed and the depletion layer 17 becomes wider than the inversion layer.

In the MOS varactor, when the gate voltage of a MOS transistor corresponds to the sum of the source terminal voltage and a threshold voltage, a channel is formed right under the gate oxide film and an electrostatic capacitance between the gate terminal and the channel, that is, the source terminal increases (the voltage is referred to as 'a capacitance changing voltage'). In this case, the capacitance between the source terminal and the bulk terminal corresponds to the sum of the capacitance Cdj between the channel and the bulk and the capacitance Cd of the depletion layer and a voltage is applied to the gate terminal such that the gate terminal is AC grounded. Therefore, it can be seen that the capacitance between the source terminal and the bulk terminal is in a grounded state, As a result, the capacitance between the source terminal and the grounded terminal is composed of the capacitance Cox of the gate silicon film, the capacitance Cdj between the channel and the bulk, and the capacitance Cd of the depletion layer. At this time, the MOS capacitance becomes maximal.

The above-mentioned MOS varactor according to the related art has a problem in that, in a general CMOS process, the electrostatic capacitance between the source terminal and the grounded terminal is changed by the variation of impurity concentration of the channel of the MOS transistor and the variation of impurity concentration of the N-type semiconductor region. For example, in a voltage-controlled oscillator using the example shown in FIG. 6, the variation of the oscillation frequency is large and the change of the capacitance changing voltage is large. In particular, it is difficult to arbitrarily determine the capacitance changing voltage and to control the frequency with a predetermined gate voltage as a center.

SUMMARY OF THE INVENTION

The invention has been finalized in view of the inherent drawbacks in the related art, and it is an object of the invention to provide a MOS varactor, which makes the variation of an oscillation frequency small by the variation of a transistor in a voltage-controlled oscillator using the MOS varactor in a general MOS process and can arbitrarily determine a capacitance changing voltage.

In order to achieve the above object, according to a first aspect of the invention, a MOS varactor using a capacitive component generated between terminals of a MOS transistor includes a resistor having one end connected to a bulk terminal and the other end grounded. A control voltage is applied to a gate terminal such that an electrostatic capacitance between source/drain terminals and the bulk terminal can vary and an electrostatic capacitance between the source/drain terminals and the gate terminal can vary. The 'resistor' can be replaced with a 'capacitor having one end connected a bulk terminal and the other end grounded'.

According to the first aspect of the invention, a capacitor Cdj between the channel and the bulk of the MOS transistor and a capacitor Cd are connected to 'a resistor' or a 'capacitor' in series. Therefore, the resistance value R or the capacitance value C can be made considerably larger than the capacitance Cdj between the channel and the bulk and the capacitance Cd of the depletion layer such that it is possible to reduce the effect of the variation of the capacitance Cdj between the channel and the bulk and the variation of the capacitance Cd of the depletion layer on the impedance between the source terminal and the grounded terminal. In other words, it is possible to make the impedance substantially equal to R or C by making R or C large. Therefore, even when variation occurs in the capacitance Cdj between the channel and the bulk or in the capacitance Cd of the depletion layer due to the manufacture variation of the MOS transistor, the impedance does not vary and thus it is possible to realize a variable capacitor with small variation of capacitance.

According to a second aspect of the invention, a MOS varactor using a capacitive component generated between terminals of a MOS transistor includes a capacitor which has one end connected to a bulk terminal and the other end grounded. A control voltage is applied to a gate terminal such that an electrostatic capacitance between source/drain terminals and the bulk terminal can vary and an electrostatic capacitance between the source/drain terminals and the gate terminal can vary.

According to the second aspect of the invention, similar to the first aspect of the invention, it is possible to suppress the variation of the impedance between the source terminal and the grounded terminal and to arbitrarily determine the bulk potential of the MOS transistor, thereby capable of controlling the frequency with a predetermined voltage as a center. In other words, it is possible to arbitrarily set the capacitance changing voltage.

According to a third aspect of the invention, a voltage-controlled oscillator includes the MOS varactor according to the first or second aspect of the invention, an amplifier having an inverter and a feedback resistor, and a piezoelectric vibrator having two terminals with the MOS varactor connected therebetween. In the voltage-controlled oscillator, the MOS varactor includes first and second MOS transistors each of which source/drain terminals are short-circuited and an electrostatic capacitance is generated between the source/drain terminals and a gate terminal of each of the first and second MOS transistors. An oscillation frequency of the MOS varactor is controlled by a control signal input to the gate terminal of each of the first and second MOS transistors.

According to the third aspect of the invention, it is possible to realize a voltage-controlled oscillator in which oscillation frequency variation is small and variation in a capacitance changing voltage is small.

According to a fourth aspect of the invention, a voltage-controlled oscillator includes the MOS varactor according to the first or second aspect of the invention, an amplifier having an inverter and a feedback resistor, and a piezoelectric vibrator having two terminals with a variable capacitive means, which includes the MOS varactor and first and second DC-blocking capacitors, connected therebetween. In the voltage-controlled oscillator, the MOS varactor includes a MOS transistor each of which source/drain terminals are short-circuited and an electrostatic capacitance is generated between the source/drain terminal and a gate terminal of the MOS transistor. Oscillating voltages with opposite phases are applied to the source/drain terminals and the gate terminal, respectively. An oscillation frequency of the MOS varactor is controlled by a control signal input to the gate terminal of each of the first and second MOS transistors.

According to the fourth aspect of the invention, it is possible to realize a voltage-controlled oscillator which can reduce the number of elements and the size.

According to the invention, it is possible to provide a MOS varactor capable of suppressing the capacitance variation due to the manufacture variation.

Further, according to the invention, it is possible to provide a voltage-controlled oscillator which can make the variation of the oscillation frequency small and arbitrarily determine the capacitance changing voltage.

BRIEF DESCRIPTION OF THE DRAWINS

FIGS. 1(A) (B) and (C) schematically show MOS varactors and equivalent circuits thereof according to a first embodiment of the invention.

FIGS. 7 (A) (B) and (C) are views schematically showing the configuration of a MOS varactor.

DESCRIPTION OF THE PREFERRED EMBODIMENTS

Hereinafter, preferred embodiments of the invention will be described with reference to the accompanying drawings. In the drawings, the same reference numerals denote the same parts.

First Embodiment

A first embodiment of the invention relates to the configuration of a MOS varactor used in a voltage-controlled oscillator according to the invention.

Figure 1:
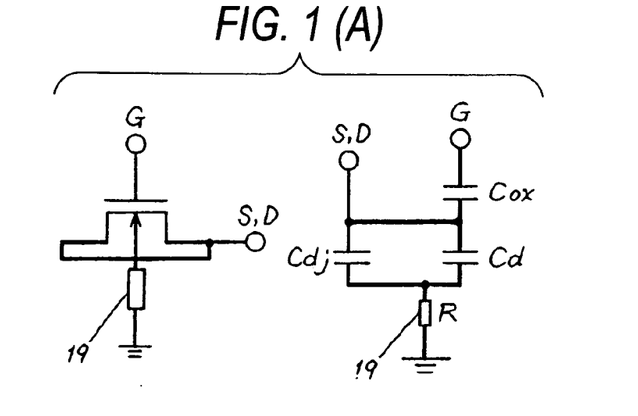

FIGS. 1A to 1C schematically show MOS varactors and equivalent circuits thereof according to the first embodiment of the invention. FIG. 1A shows a first configuration in which one end of a resistor is connected to a bulk terminal of a MOS transistor and the other end of the resistor is grounded. FIG. 1B shows a second configuration in which one end of a capacitor is connected to a bulk terminal of a MOS transistor and the other end of the capacitor is grounded. FIG. 1C shows a third configuration in which one ends of a resistor and a capacitor are connected to a bulk terminal of a MOS transistor, a bias is applied to the other end of the resistor, and the other end of the capacitor is grounded.

First, as shown in FIG. 1A, in the first configuration of the MOS varactor, a depletion layer Cd and a capacitor Cdj between a channel and a bulk are respectively connected to a resistor 19 in series. Therefore, the impedance between a source terminal and a grounded terminal is expressed by the following equation.

$$1/(sCd+sCdj)+R$$

As can be seen from the above equation, when the resistance value R of the resistor 19 is set to an appropriate value, the impedance between the source terminal and the grounded terminal can be made to be a value substantially equal to the resistance value R. Accordingly, the influence of a value of each of the depletion layer Cd and the capacitor Cdj between the channel and the bulk can decrease. In other words, the variation of the capacitance value of the MOS varactor due to the variation of the transistor can be suppressed.

Similarly, in the second configuration shown in FIG. 1B, due to the connection of a capacitor 20, the impedance between the source terminal and the grounded terminal is expressed by the following equation:

$$1/(sCd+sCdk)+1/sC, \text{ where } s=j\omega$$

Even in the above equation, similarly, the impedance between the source terminal and the grounded terminal can be made to be a value substantially equal to the capacitance value C by setting the capacitance value C of the capacitor 20. Therefore, the variation of the MOS varactor due to the variation of the transistor can be suppressed.

Meanwhile, in the third configuration shown in FIG. 1C, in addition to the same effects as in the first configuration shown in FIG. 1A and the second configuration shown in FIG. 1B, it is possible to control a frequency with a predetermined gate voltage as a center by arbitrarily determining a potential of the bias 21 applied to the other end of the resistor 19.

Figure 2:
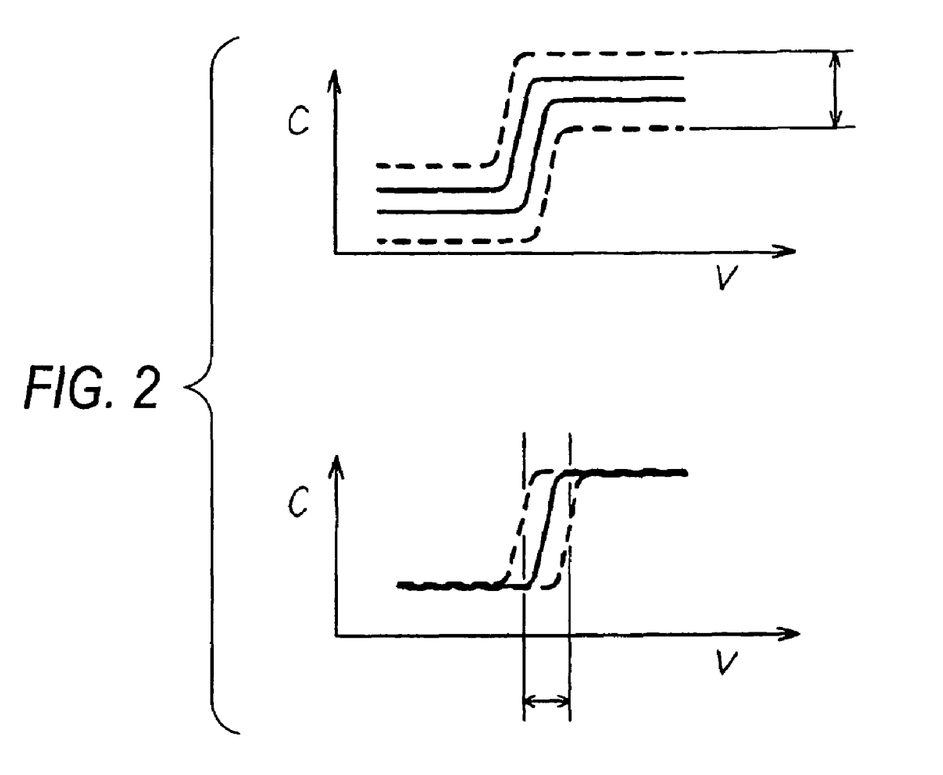
FIG. 2 is a view showing C-V characteristics explaining the first embodiment of the invention.

In FIG. 2, each solid line represents a C-V characteristic of an electrostatic capacitance generated between terminals of the MOS transistor according to the invention, and each dashed line represents a C-V characteristic of an electrostatic capacitance generated between terminals of the MOS transistor according to the related art. On the basis of FIG. 2, it is possible to reduce the variation of the electrostatic capacitance between a gate terminal and a source terminal or between a gate terminal and a drain terminal, to arbitrarily control a capacitance changing voltage by applying a voltage to the bulk terminal, and to easily design the oscillator circuit.

Second Embodiment

Figure 3:
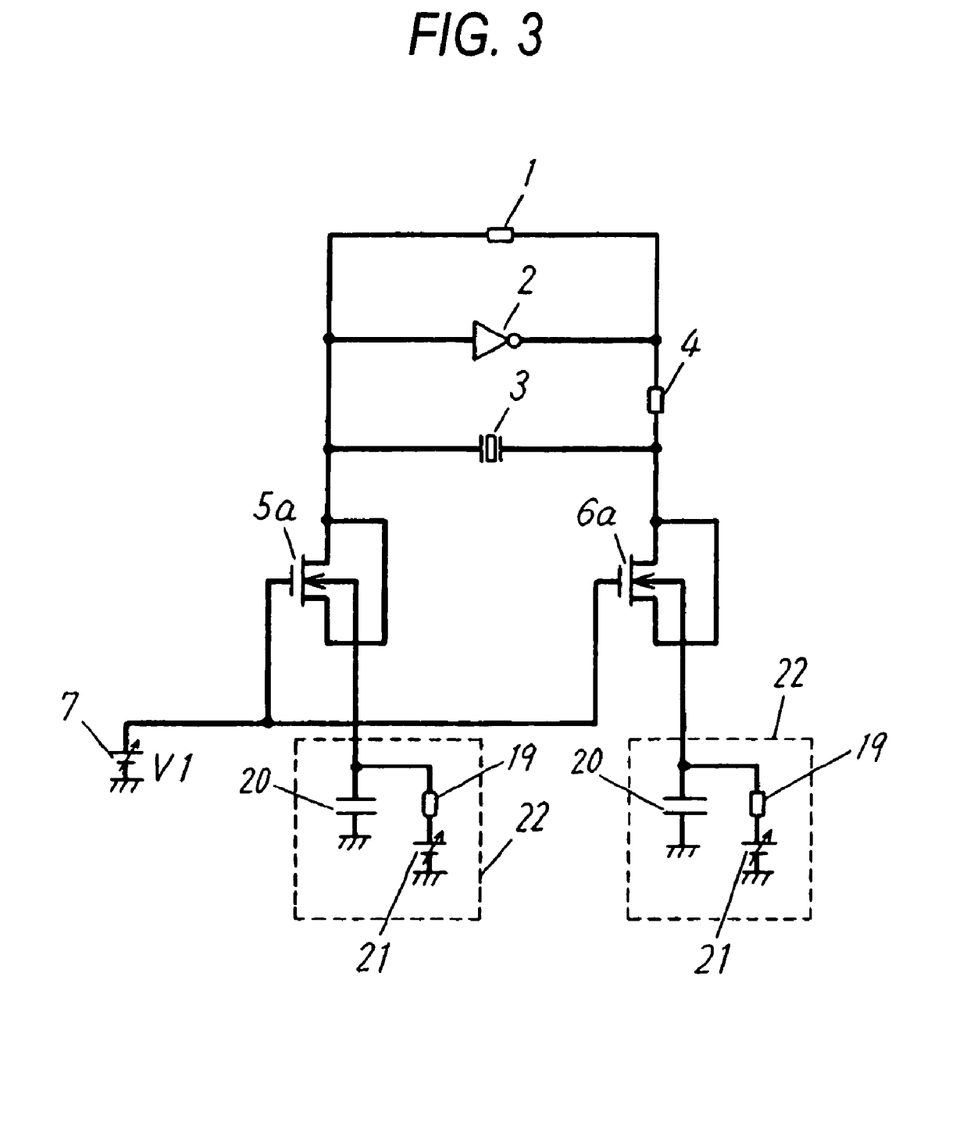
FIG. 3 is a circuit diagram schematically showing the configuration of a voltage-controlled oscillator according to a second embodiment of the invention.

FIG. 3 is a circuit diagram schematically showing the configuration of a voltage-controlled oscillator according to a second embodiment of the invention. The voltage-controlled oscillator according to this embodiment is a MOS varactor and uses the MOS varactor according to the first embodiment of the invention. Here, the third configuration shown in FIG. 1C is adopted.

As shown in FIG. 3, even in the voltage-controlled oscillator according to the present embodiment, a source terminal and a drain terminal of each of first and second MOS transistors 5a and 6a are short-circuited, in the same manner as in the voltage-controlled oscillator according to the related art shown in FIG. 6. Furthermore, a variable capacitive element is used which uses an electrostatic capacitance between the source terminal and a gate terminal or between the drain terminal and the gate terminal of each of the first and second MOS transistors 5a and 6a. In particular, the voltage-controlled oscillator is an oscillating circuit including an amplifier, which is composed of an inverter 2 and a feedback resistor 1 forming a feedback circuit, a crystal vibrator 3, and a load capacitor. The variable capacitive element is used as the load capacitor. A bulk terminal of each of the first and second transistors 5a and 6a is connected to an element composed of a capacitor, a resistor, and a bias applying voltage source. The electrostatic capacitance generated between the source terminal and the gate terminal or between the drain terminal and the gate terminal of each of the first and second MOS transistors 5a and 6a is controlled by a voltage source 7 connected to a gate terminal.

According to this embodiment, each of the first and second MOS transistors 5a and 6a serving as a load capacitor has a configuration in which the bulk terminal is connected to one ends of a resistor and a capacitor, a bias is applied to the other end of the resistor, and the other end of the capacitor is grounded. Therefore, the impedance between the source terminal and the grounded terminal of each of the first and second MOS transistors 5a and 6a is stable, and the variation of the capacitance value of the load capacitor due to the variation of each of the transistors is suppressed.

Further, according to the embodiment, it is possible to control the capacitance changing voltage by applying a bias voltage to the bulk terminal of each of the transistors 5a and 6a.

Third Embodiment

Figure 4:
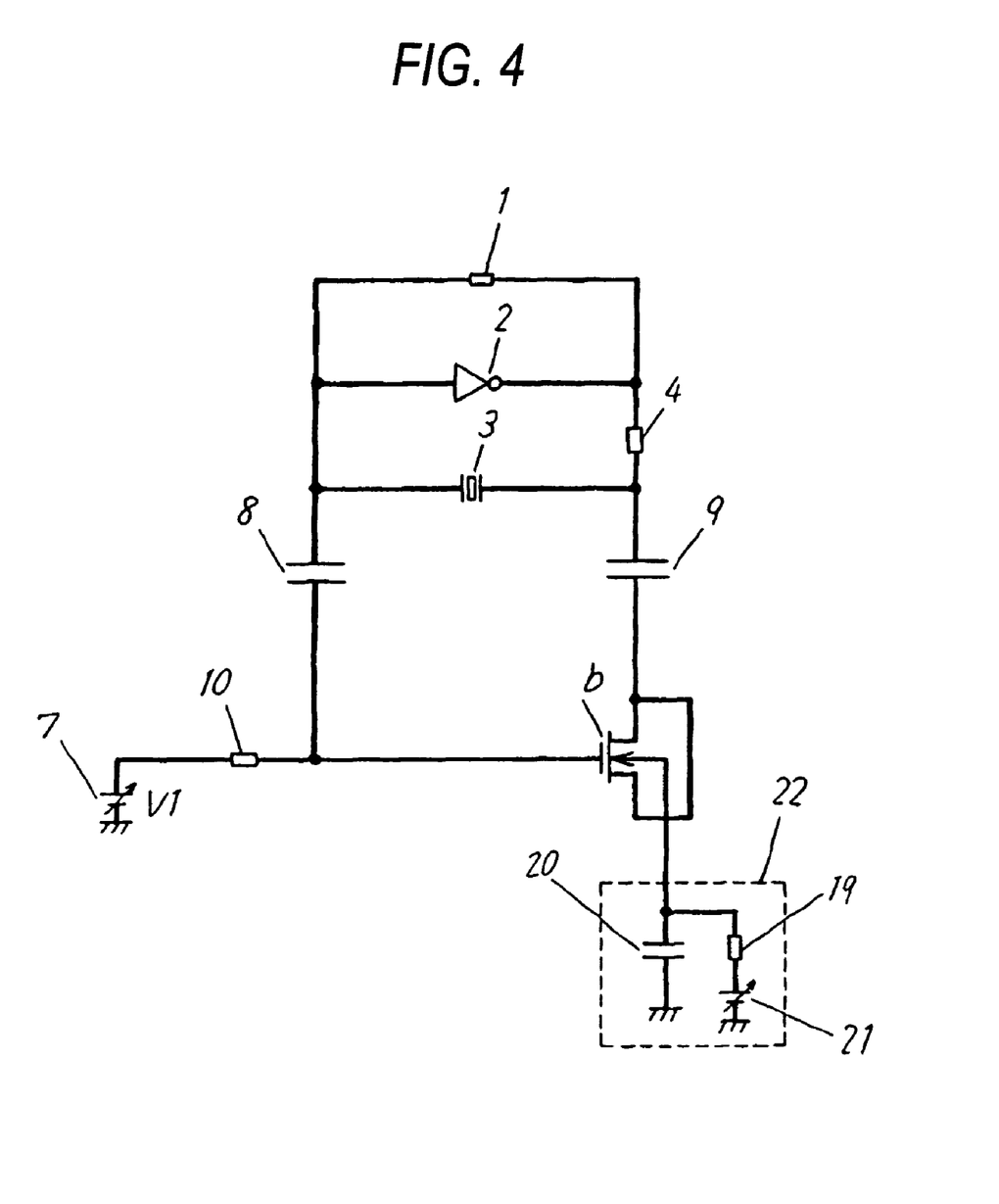
FIG. 4 is a circuit diagram schematically showing the configuration of a voltage-controlled oscillator according to a third embodiment of the invention.

FIG. 4 is a circuit diagram schematically showing a voltage-controlled oscillator according to a third embodiment of the invention. The voltage-controlled oscillator according to this embodiment is an oscillator circuit including an amplifier, which is composed of an inverter 2 and a feedback resistor 1 forming a feedback circuit and, a crystal vibrator 3, and a load capacitor. As the load capacitor, a first DC-blocking capacitor 8, a variable capacitor composed of a MOS transistor 6b having the third configuration shown in FIG. 1C, and a second DC-blocking capacitor 9 are adopted.

According to this configuration, the phase difference between a gate terminal and source/drain terminals of the MOS transistor 6b is 180°. Therefore, the capacitance value of the MOS varactor becomes equivalent to about twice the capacitance value due to a mirror effect.

In the voltage-controlled oscillator, the frequency variable range is narrowed as compared to the voltage-controlled oscillator according to the second embodiment of the invention, and the load capacitor as viewed from a piezoelectric vibrator is reduced. Therefore, a negative resistance of the oscillating circuit is reduced and thus starting time of the voltage-controlled oscillator circuit can be improved.

In particular, in this embodiment, since the MOS transistor is configured as a varactor, the variation of frequency with respect to the control voltage can be realized by 100 ppm or more, and the frequency variation width enough to perform temperature compensation and external voltage frequency control can be ensured. Further, since it is not necessary to increase the number of elements, it is possible to reduce the size of the oscillator and thus the oscillator can correspond to a small crystal vibrator.

In the voltage-controlled oscillator according to the invention, it is possible to control an oscillation frequency by using an electrostatic capacitance generated between the source/drain terminals and the gate terminal of the MOS transistor in which the source terminal and the drain terminal are short-circuited and which serves as a variable capacitor. Therefore, the voltage-controlled oscillator according to the invention is useful as a crystal oscillator for compensating the temperature by voltage control.

What is claimed is:

1. A MOS varactor using a capacitive component generated between terminals of a MOS transistor, comprising:
   a resistor which has one end connected to a back gate terminal and the other end grounded,
   wherein a control voltage is applied to a gate terminal such that an electrostatic capacitance between source/drain terminals and the back gate terminal can vary and an electrostatic capacitance between the source/drain terminals and the gate terminal can vary.

2. A MOS varactor using a capacitive component generated between terminals of a MOS transistor, comprising:
   a capacitor which has one end connected to a back gate terminal and the other end grounded,
   wherein a control voltage is applied to a gate terminal such that an electrostatic capacitance between source/drain terminals and the back gate terminal can vary and an electrostatic capacitance between the source/drain terminals and the gate terminal can vary.

3. A MOS varactor using a capacitive component generated between terminals of a MOS transistor, comprising:
   a resistor which has one end connected to a back gate terminal,
   a variable voltage source connected to the other end of the resistor, and
   a capacitor which has one end connected to the back gate terminal and the other end grounded,
   wherein a control voltage is applied to a gate terminal such that an electrostatic capacitance between source/drain terminals and the back gate terminal can vary and an electrostatic capacitance between the source/drain terminals and the gate terminal can vary.

4. A voltage-controlled oscillator comprising:
   the MOS varactor according to claim 1,
   an amplifier having an inverter and a feedback resistor, and
   a piezoelectric vibrator having two terminals with the MOS varactor connected therebetween,
   wherein the MOS varactor includes first and second MOS transistors each of which source/drain terminals are short-circuited, and an electrostatic capacitance is generated between the source/drain terminals and a gate terminal of each of the first and second MOS transistors, and
   an oscillation frequency of the MOS varactor is controlled by a control signal input to the gate terminal of each of the first and second MOS transistors.

5. A voltage-controlled oscillator comprising:
   the MOS varactor according to claim 2,
   an amplifier having an inverter and a feedback resistor, and
   a piezoelectric vibrator having two terminals with the MOS varactor connected therebetween,
   wherein the MOS varactor includes first and second MOS transistors each of which source/drain terminals are short-circuited, and an electrostatic capacitance is generated between the source/drain terminals and a gate terminal of each of the first and second MOS transistors, and
   an oscillation frequency of the MOS varactor is controlled by a control signal input to the gate terminal of each of the first and second MOS transistors.

6. A voltage-controlled oscillator comprising:
   the MOS varactor according to claim 3,
   an amplifier having an inverter and a feedback resistor, and
   a piezoelectric vibrator having two terminals with the MOS varactor connected therebetween,
   wherein the MOS varactor includes first and second MOS transistors each of which source/drain terminals are short-circuited, and an electrostatic capacitance is generated between the source/drain terminals and a gate terminal of each of the first and second MOS transistors, and
   an oscillation frequency of the MOS varactor is controlled by a control signal input to the gate terminal of each of the first and second MOS transistors.

7. A voltage-controlled oscillator comprising:
   the MOS varactor according to claim 1,
   an amplifier having an inverter and a feedback resistor, and
   a piezoelectric vibrator having two terminals with a variable capacitive means, which includes the MOS varactor and first and second DC-blocking capacitors, connected therebetween,
   wherein the MOS varactor includes a MOS transistor each of which source/drain terminals are short-circuited, and an electrostatic capacitance is generated between the source/drain terminals and a gate terminal of the MOS transistor,
   oscillating voltages with opposite phases are applied to the source/drain terminals and the gate terminal, respectively, and
   an oscillation frequency of the MOS varactor is controlled by a control signal input to the gate terminal of each of the first and second MOS transistors.

8. A voltage-controlled oscillator comprising:
   the MOS varactor according to claim 2,
   an amplifier having an inverter and a feedback resistor, and
   a piezoelectric vibrator having two terminals with a variable capacitive means, which includes the MOS varactor and first and second DC-blocking capacitors, connected therebetween,
   wherein the MOS varactor includes a MOS transistor each of which source/drain terminals are short-circuited, and an electrostatic capacitance is generated between the source/drain terminals and a gate terminal of the MOS transistor, oscillating voltages with opposite phases are applied to the source/drain terminals and the gate terminal, respectively, and an oscillation frequency of the MOS varactor is controlled by a control signal input to the gate terminal of each of the first and second MOS transistors.

9. A voltage-controlled oscillator comprising:

the MOS varactor according to claim 3, an amplifier having an inverter and a feedback resistor, and a piezoelectric vibrator having two terminals with a variable capacitive means, which includes the MOS varactor and first and second DC-blocking capacitors, connected therebetween, wherein the MOS varactor includes a MOS transistor each of which source/drain terminals are short-circuited, and an electrostatic capacitance is generated between the source/drain terminals and a gate terminal of the MOS transistor, oscillating voltages with opposite phases are applied to the source/drain terminals and the gate terminal, respectively, and an oscillation frequency of the MOS varactor is controlled by a control signal input to the gate terminal of each of the first and second MOS transistors.

* * * * *